US006772072B2

(12) United States Patent
Ganguli et al.

(10) Patent No.: US 6,772,072 B2
(45) Date of Patent: Aug. 3, 2004

(54) METHOD AND APPARATUS FOR MONITORING SOLID PRECURSOR DELIVERY

(75) Inventors: Seshadri Ganguli, Sunnyvale, CA (US); Vincent W. Ku, San Jose, CA (US); Hua Chung, San Jose, CA (US); Ling Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 10/200,613

(22) Filed: Jul. 22, 2002

(65) Prior Publication Data

US 2004/0015300 A1 Jan. 22, 2004

(51) Int. Cl.[7] .................... G06F 19/00; G01N 33/00; C23C 16/00
(52) U.S. Cl. ................... 702/24; 436/34; 427/248.1
(58) Field of Search ............................ 702/46, 23, 24; 118/726; 73/1.36, 23.2, 30.02, 861.04, 861.27, 861.351; 250/303, 364; 137/2, 6, 487.5; 324/324; 427/248.1, 253, 255.8; 436/30, 34, 72, 76

(56) References Cited

U.S. PATENT DOCUMENTS

| 4,058,430 A | 11/1977 | Suntola et al. ............... 156/611 |
| 4,389,973 A | 6/1983 | Suntola et al. ............... 118/725 |
| 4,413,022 A | 11/1983 | Suntola et al. ............ 427/255.2 |

(List continued on next page.)

FOREIGN PATENT DOCUMENTS

| EP | 1 167 569 | 1/2002 | ......... C23C/16/455 |
| GB | 2 355 727 | 5/2001 | ........... C23C/16/44 |
| JP | 58098917 | 6/1983 | ............. H03J/7/02 |

(List continued on next page.)

OTHER PUBLICATIONS

J.P. Stagg, J. Christer, E. J. Thrush and J. Crawley, "Measurement and Control of Reagent Concentrations in MOCVD Reactor Using Ultrasonics," Journal of Crystal Growth 120(1992) pp. 98–102.

"MultiGas™ 2030," MKS Instruments, Inc., Bulletin 2030-04/02.

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

(List continued on next page.)

*Primary Examiner*—John Barlow
*Assistant Examiner*—John Le
(74) *Attorney, Agent, or Firm*—Moser, Patterson & Sheridan, LLP (57) ABSTRACT

A method and apparatus for monitoring the delivery of a solid precursor from a vessel to a process chamber via a process gas produced by flowing a carrier gas into the vessel is provided. The precursor typically changes state from a solid to a gas (vapor) through a sublimation process within the chamber. The apparatus comprises a gas analyzer to generate a first signal indicative of a density of the precursor in the process gas and a controller. The controller receives the first signal and a second signal indicative of a volume flow rate of the process gas or the carrier gas and calculates a mass flow rate and/or a total amount consumed of the precursor based on the first and second signals. The controller may calculate an amount precursor remaining in the vessel based on the total amount consumed and an initial amount. The amount of precursor remaining in the vessel may be used by an operator to efficiently schedule replacement or replenishment of the precursor in an effort to minimize material waste and processing down time.

35 Claims, 5 Drawing Sheets

U.S. PATENT DOCUMENTS

| | | | |
|---|---|---|---|
| 4,834,831 A | 5/1989 | Nishizawa et al. | 156/611 |
| 4,993,357 A | 2/1991 | Scholz | 118/715 |
| 5,225,366 A | 7/1993 | Yoder | 437/108 |
| 5,281,274 A | 1/1994 | Yoder | 118/697 |
| 5,294,286 A | 3/1994 | Nishizawa et al. | 156/610 |
| 5,360,738 A | 11/1994 | Jones et al. | 436/30 |
| 5,374,570 A | 12/1994 | Nasu et al. | 437/40 |
| 5,441,703 A | 8/1995 | Jurgensen | 422/129 |
| 5,443,647 A | 8/1995 | Aucoin et al. | 118/723 |
| 5,480,818 A | 1/1996 | Matsumoto et al. | 437/40 |
| 5,483,919 A | 1/1996 | Yokoyama et al. | 117/89 |
| 5,503,875 A | 4/1996 | Imai et al. | 427/255.3 |
| 5,674,786 A | 10/1997 | Turner et al. | 437/225 |
| 5,711,811 A | 1/1998 | Suntola et al. | 118/711 |
| 5,796,116 A | 8/1998 | Nakata et al. | 257/66 |
| 5,807,792 A | 9/1998 | Ilg et al. | 438/758 |
| 5,835,677 A | 11/1998 | Li et al. | 392/401 |
| 5,855,680 A | 1/1999 | Soininen et al. | 118/719 |
| 5,866,795 A | 2/1999 | Wang et al. | 73/1.36 |
| 5,879,459 A | 3/1999 | Gadgli et al. | 118/715 |
| 5,916,365 A | 6/1999 | Sherman | 117/92 |
| 5,923,056 A | 7/1999 | Lee et al. | 257/192 |
| 6,015,590 A | 1/2000 | Suntola et al. | 427/255.23 |
| 6,015,917 A | 1/2000 | Bhandari et al. | 556/12 |
| 6,042,652 A | 3/2000 | Hyun et al. | 118/719 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,231,672 B1 | 5/2001 | Choi et al. | 118/715 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 |
| 6,306,216 B1 | 10/2001 | Kim et al. | 118/725 |
| 6,342,277 B1 | 1/2002 | Sherman | 427/562 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,649 B1 * | 11/2002 | Gogol, Jr. et al. | 436/34 |
| 6,482,733 B2 | 11/2002 | Raaijmakers | 438/633 |
| 6,511,539 B1 | 1/2003 | Raaijmakers | 117/102 |
| 6,551,406 B2 | 4/2003 | Kilpi | 118/728 |
| 2001/0000866 A1 | 5/2001 | Sneh et al. | 118/723 |
| 2001/0002280 A1 | 5/2001 | Sneh | 427/255.28 |
| 2001/0009140 A1 | 7/2001 | Bondestan et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0009544 A1 | 1/2002 | McFeely et al. | 427/248.1 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.28 |
| 2002/0048635 A1 | 4/2002 | Kim et al. | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0082296 A1 | 6/2002 | Verschoor et al. | 514/557 |
| 2002/0086106 A1 | 7/2002 | Park et al. | 427/248.1 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0106536 A1 | 8/2002 | Lee et al. | 428/702 |
| 2002/0108570 A1 | 8/2002 | Lindfors | 118/715 |
| 2002/0134307 A1 | 9/2002 | Choi | 118/715 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0197402 A1 | 12/2002 | Chiang et al. | 427/255.39 |
| 2003/0004723 A1 | 1/2003 | Chihara | 704/260 |
| 2003/0013320 A1 | 1/2003 | Kim et al. | 438/778 |
| 2003/0031807 A1 | 2/2003 | Elers et al. | 427/569 |
| 2003/0042630 A1 | 3/2003 | Babcoke et al. | 261/121.1 |
| 2003/0049942 A1 | 3/2003 | Haukka et al. | 438/778 |
| 2003/0072875 A1 * | 4/2003 | Sandhu | 427/248.1 |
| 2003/0072975 A1 | 4/2003 | Shero et al. | 428/704 |
| 2003/0075273 A1 | 4/2003 | Kilpela et al. | 156/345.33 |
| 2003/0075925 A1 | 4/2003 | Lindfors et al. | 285/367 |

FOREIGN PATENT DOCUMENTS

| | | | |
|---|---|---|---|
| JP | 4291916 | 9/1992 | C30B/25/10 |
| JP | 5047666 | 2/1993 | H01L/21/205 |
| JP | 5206036 | 8/1993 | H01L/21/205 |
| JP | 5234899 | 9/1993 | H01L/21/205 |
| JP | 5270997 | 10/1993 | C30B/29/68 |
| JP | 6224138 | 5/1994 | C30B/25/14 |
| JP | 2000319772 | 3/2000 | C23C/16/00 |
| JP | 2001020075 | 11/2000 | C23C/16/44 |

| | | | | |
|---|---|---|---|---|
| JP | 2001111000 | 4/2001 | .......... | H01L/27/105 |
| JP | 2001172767 | 6/2001 | ........... | C23C/16/40 |
| WO | WO 96/17107 | 6/1996 | ........... | C23C/16/44 |
| WO | WO 99/01595 | 1/1999 | ........... | C30B/25/14 |
| WO | WO 99/29924 | 6/1999 | ........... | C23C/16/04 |
| WO | WO 99/65064 | 12/1999 | ........... | H01L/21/00 |
| WO | WO 00/16377 | 3/2000 | | |
| WO | WO 00/54320 | 9/2000 | ........... | H01L/21/44 |
| WO | WO 00/79576 | 12/2000 | ......... | H01L/21/205 |
| WO | WO 01/15220 | 3/2001 | ......... | H01L/21/768 |
| WO | WO 01/17692 | 3/2001 | ........... | B05C/11/00 |
| WO | WO 01/27346 | 4/2001 | ........... | C23C/16/44 |
| WO | WO 01/27347 | 4/2001 | ........... | C23C/16/44 |
| WO | WO 01/29280 | 4/2001 | ........... | C23C/16/32 |
| WO | WO 01/29891 | 4/2001 | ......... | H01L/21/768 |
| WO | WO 01/29893 | 4/2001 | ......... | H01L/21/768 |
| WO | WO 01/36702 | 5/2001 | ........... | C23C/16/00 |
| WO | WO 01/66832 | 9/2001 | ........... | C30B/25/14 |
| WO | WO 02/08485 | 1/2002 | ........... | C23C/16/00 |
| WO | WO 02/08488 | 1/2002 | ........... | C23C/16/44 |
| WO | WO 02/43115 | 5/2002 | | |
| WO | WO 02/45167 | 6/2002 | ........... | H01L/27/00 |

OTHER PUBLICATIONS

Kukli, et al., "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236–42.

Kukli, et al., "Properties of Ta$_2$O$_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of {Nb$_{1-x}$Ta$_x$}$_2$O$_5$ Solid Solutions and {Nb$_{1-x}$Ta$_x$}$_2$O$_5$–ZrO$_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p2016–20.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

METHOD AND APPARATUS FOR MONITORING SOLID PRECURSOR DELIVERY

BACKGROUND OF THE INVENTION

1. Field of the Invention

Embodiments of the present invention generally relate to semiconductor processing, and particularly to monitoring solid precursor delivery to a semiconductor process chamber.

2. Background of the Related Art

As integrated circuit (IC) density increases, the need for greater uniformity and process control regarding layer thickness rises. IC fabricators make aggressive demands on the semiconductor processing industry to develop fabrication tools that provide for larger production yields while increasing the uniformity of layers deposited on substrates having increasingly larger surface areas. In response to these demands, various technologies have been developed to deposit layers on substrates in a cost-effective manner, while maintaining control over the characteristics of the layer.

For example, chemical vapor deposition (CVD) is a common deposition process employed for depositing layers on a substrate by introducing reactive precursors into a process chamber and allowing the precursors to react with the substrate. A variant of CVD that is being explored for its potential to demonstrate superior layer uniformity is atomic layer deposition (ALD). ALD comprises sequential steps of physisorption (physical absorption) or chemisorption (chemical absorption) that deposit monolayers of reactive precursor molecules on a substrate. A pulse of a first reactive precursor is introduced into a process chamber to deposit a first monolayer of molecules on the substrate. A pulse of a second reactive precursor follows to form an additional monolayer of molecules adjacent to the first monolayer. The additional monolayer typically reacts with the first monolayer to form the desired film. In this manner, a layer is formed on the substrate by alternating pulses of the appropriate reactive precursors into the process chamber. The cycle is repeated to form the layer to a desired thickness.

Both CVD and ALD require precise control of reactive precursors introduced into the process chamber in order to produce a desired layer of uniform thickness. For some applications of CVD and ALD, one or more of the precursors come in the form of a solid. Typically, the precursor changes state from a solid to a gas (vaporizes) at a certain pressure and temperature via a sublimation process carried out within a storage vessel. The solid precursor is delivered to the process chamber via a process gas produced by flowing a carrier gas through the vessel. (i.e., the process gas comprises the vaporized solid precursor mixed with the carrier gas). The rate of sublimation depends on a temperature of the solid precursor, a surface area of the solid precursor, and how the carrier gas flows through the vessel, each of which may be very difficult to control. Accordingly, it is often difficult to deliver a predictable amount of the solid precursor to the process chamber.

The difficulty in delivering a predictable amount of the solid precursor to the process chamber may lead to a number of problems. One problem is that irregularities in the amount of solid precursor delivered to the process chamber may result in nonuniformities in film thickness that adversely affect wafer quality and acceptability. A more fundamental problem, however, is that unless the amount of solid precursor that has been delivered to the process chamber is known, it is difficult to determine how much solid precursor remains in the vessel. It is therefore difficult to predict when the remaining solid precursor will be depleted. Typically, there is no simple method for measuring the amount of solid precursor remaining in the vessel. There is typically no visual indication of the level of the solid precursor through the vessel. Further, because the vessel is connected directly to a gas line, there is no simple method to weigh the vessel.

Current methods of predicting the amount of solid precursor remaining in a vessel range from a "best estimate" approach based on experience to complex software algorithms that take into account various process variables, such as vessel temperature, vessel pressure and carrier gas volume flow rate. However, neither approach provides an adequately accurate prediction of depletion time and may result in replacing the solid precursor vessel prematurely or after complete depletion. Replacing the solid precursor vessel prematurely increases operating cost in the form of material waste and unnecessary down time. Replacing the solid precursor after complete depletion may result in wasted process cycles lacking solid precursor and scrapped wafers.

Therefore, a need exists for an improved method and apparatus for monitoring the delivery of solid precursor to a processing chamber.

SUMMARY OF THE INVENTION

Embodiments of the present invention provide an apparatus, method, and system for monitoring delivery of a precursor from a vessel to a process chamber via a process gas. The precursor is initially stored as a solid in the vessel prior to changing state to a gas through a sublimation process in the vessel.

The apparatus generally comprises a gas analyzer and a flow meter in communication with a controller. The gas analyzer generates a first signal indicative of a density of the precursor in the process gas. The flow meter generates a second signal indicative of a volume flow rate of the process gas or a carrier gas flowing into the vessel to produce the process gas. The controller calculates a mass flow rate for the precursor based on the first and second signals. Using the calculated mass flow rate, the controller may also calculate a total amount of precursor delivered to the process chamber and an amount of precursor remaining based on an initial amount. The gas analyzer may be any suitable gas analyzer and, for some embodiments, may comprise a Fourier transform infrared (FTIR) spectrometer.

The method generally comprises measuring a density of the precursor in the process gas, measuring a volume flow rate of the gas, and calculating a mass flow rate for the precursor based on the measured density of the precursor in the process gas and the measured volume flow rate of the gas. The method may further comprise calculating a total amount of precursor delivered to the process chamber, calculating an amount of precursor remaining based on an initial amount, and predicting an amount of time before the remaining precursor is depleted.

The system generally comprises a process chamber, a vessel containing a solid precursor to be delivered to the process chamber via a process gas produced by flowing a carrier gas into the vessel, and a solid precursor delivery monitor (SPDM) disposed between the process chamber and the vessel. The SPDM comprises a gas analyzer to generate a first signal indicative of a density of the precursor in the process gas and an integral controller to receive the first signal and a second signal indicative of a volume flow rate of the process gas or the carrier gas. The integral controller calculates the mass flow rate for the precursor based on the first and second signals and communicates the calculated mass flow rate to a system controller. Alternatively, the first and second signals may be routed directly to the system controller.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of the inventions and are therefore not to be considered limiting of its scope, for the invention may admit to other equally effective embodiments.

To facilitate understanding, identical reference numerals have been used, wherever possible, to designate identical elements that are common in the figures.

DETAILED DESCRIPTION OF THE INVENTION

Figure 1:
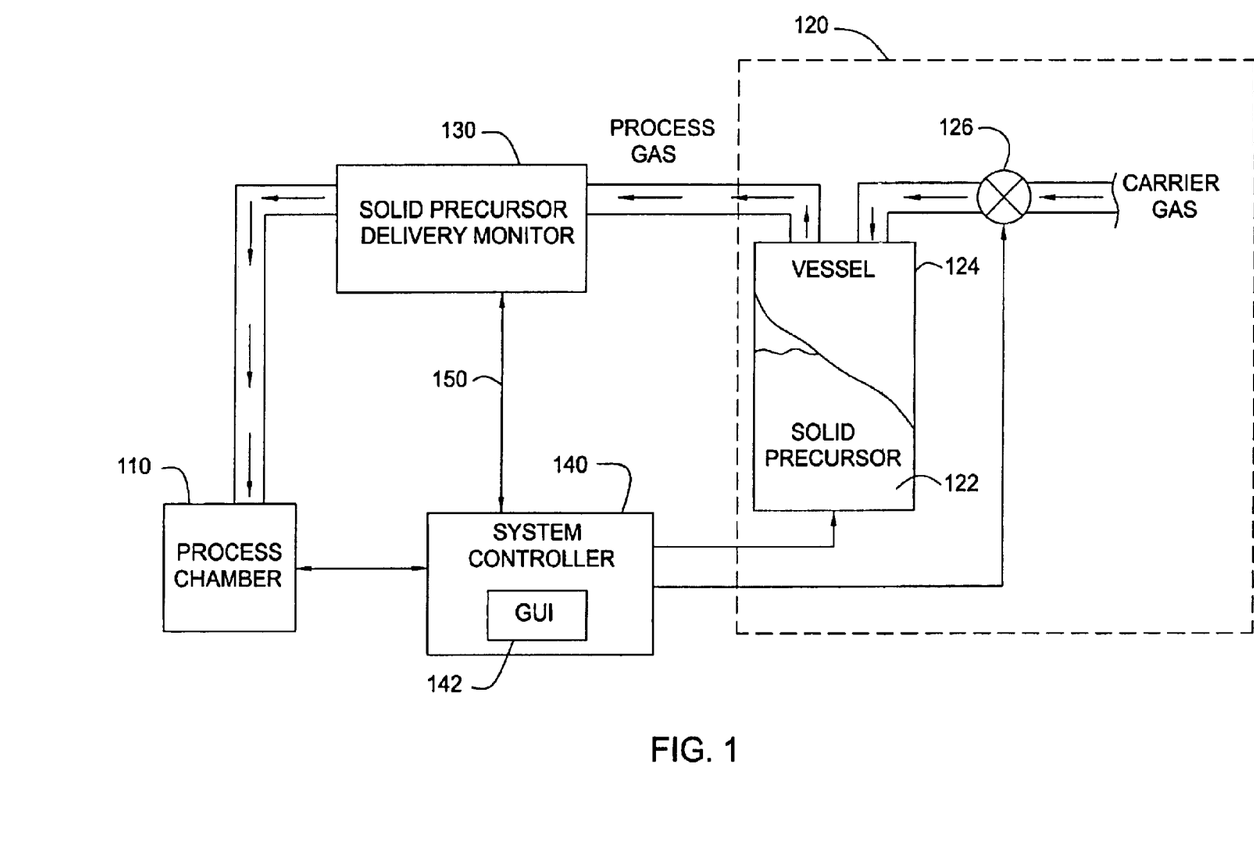
FIG. 1 illustrates an exemplary semiconductor processing system having a solid precursor monitoring system.

FIG. 1 illustrates an exemplary semiconductor processing system comprising a process chamber 110, a gas delivery system 120, and a solid precursor delivery monitor (SPDM) 130. The process chamber 110 may be any suitable semiconductor process chamber, such as a chemical vapor deposition (CVD) chamber, atomic layer deposition (ALD) chamber, or etch chamber. For some embodiments the etch chamber may be suitable to perform tantalum nitride (TaN) ALD. Examples of suitable process chambers include, but are not limited to, the PRODUCER® series of CVD chambers, the SPRINT® and ENDURA® series of CVD/ALD chambers, and the CENTURA® series of etch chambers, available from Applied Materials, Inc. of Santa Clara, Calif.

The gas delivery system 120 transports a precursor 122 from a vessel 124 to the process chamber 110 via a process gas. Typically, the precursor 122 changes state from a solid to a gas (or vapor) in the vessel 124 by a sublimation process. The sublimation process for the precursor 122 may be initiated by any suitable well-known technique. For example, the precursor 122 may be heated to a predetermined temperature or mixed with a bubbling liquid within the vessel 124. For some embodiments, the temperature of the vessel 124 may be controlled in an effort to regulate the sublimation process.

A carrier gas flows through a valve 126 into the vessel 124 and mixes with the vaporized precursor 122 to form the process gas. The process gas then flows out of the vessel 124 and transports the vaporized precursor 122 to the process chamber 110. For some embodiments, the gas delivery system 120 may include a bypass line, for example, from the valve 126 to the process chamber. The bypass line may allowing the carrier gas to flow directly to the process chamber which may be useful for purging the process chamber.

The material of the precursor 122 may be chosen based on the particular process to be performed in the process chamber 110. For example, the precursor 122 may be a metal organic material, such as tungsten carbonyl (W(CO)6) to deposit a metal film (W) on a wafer. As another example, the precursor 122 may be pentadimethylamino-tantalum (PDMAT) to form a film comprising tantalum. As other examples, the precursor 122 may also be a precursor to deposit a layer of dielectric material on the wafer, or xenon diflouride ($XeF_2$), for example, to deliver fluoride to an etch chamber. The carrier gas is typically chosen based on the precursor 122. For example, argon may be chosen as the carrier gas if the precursor 122 is tungsten carbonyl. The carrier gas may be an inert gas, such as argon or helium, and may be reactive or non-reactive with the precursor 122.

To facilitate understanding, the gas delivery system 120 is illustrated as delivering only one gas to the process chamber 110. However, the gas delivery system 120 may deliver additional gases (i.e. carrying additional precursors) to the process chamber 110 and multiple gas delivery systems are also contemplated. It will also be appreciated by those skilled in the art that the gas delivery system 120 may also comprise additional components not illustrated, such as bypass valves, purge valves, flow controllers, and/or temperature controllers.

The vessel 124 may be any suitable container, for example, capable of withstanding the pressure and temperature required to sublimate the precursor 122. For some embodiments, the container may comprise a bubbler, well known in the art. As previously described, in conventional processing systems, it may be difficult to determine an amount of precursor 122 that has been delivered to the process chamber 110 and, therefore, an amount of the precursor 122 remaining in the vessel 124.

Solid Precursor Delivery Monitor

However, embodiments of the present invention utilize the solid precursor delivery monitor (SPDM) 130 to calculate a mass flow rate of precursor 122 that has been delivered to the process chamber 110 based on measured precursor densities and measured volume flow rates of the process gas. As used herein, mass flow rate refers to a mass amount of precursor 122 flowing from the vessel 124, volume flow rate refers to a volume of process gas flowing from the vessel 124, and precursor density refers to a mass of precursor material in a given volume of the process gas. It should be noted that the SPDM 130 may be used to monitor delivery of solid or liquid precursor material in a process gas. However, due to the previously described difficulties in regulating the sublimation process and/or determining an amount of solid precursor remaining in a vessel, the SPDM 130 may be used most advantageously to monitor solid precursor delivery.

As illustrated, the SPDM 130 is disposed in-line with the process gas flow between the gas delivery system 120 and the process chamber 110. For other embodiments, the SPDM 130 may be disposed between a gas delivery system and a reservoir (not shown). For example, the reservoir may be filled with the process gas containing the precursor 122. The precursor 122 may then be delivered from the reservoir to the process chamber 110.

Figure 2:
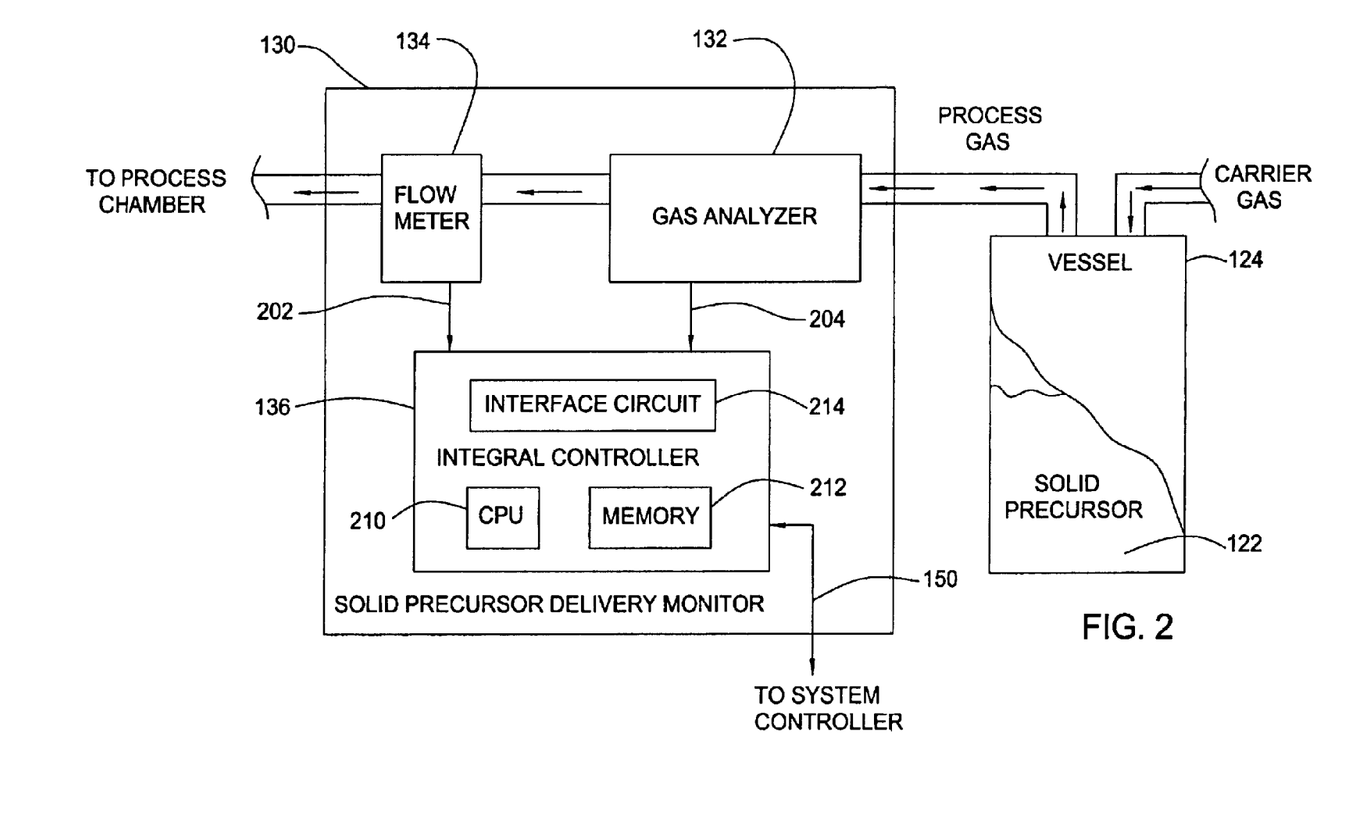
FIG. 2 illustrates one embodiment of a solid precursor monitoring system.

FIG. 2 illustrates an embodiment of the SPDM 130, comprising a gas analyzer 132, a flow meter 134, and an integral controller 136. Due to the conservation of mass, the flow of the process gas entering the SPDM 130 is equal to the flow of process gas exiting the SPDM 130. Therefore, the flow meter 134 may be located either downstream (as shown) or upstream from the gas analyzer 132. The flow meter 134 may be any suitable flow meter capable of generating a signal on an output 202 indicative of a volume flow rate of the process gas. The signal may be an analog signal, a serial communications signal (i.e., RS-232, RS-485, etc.), or any other suitable signal.

For some embodiments, the flow meter 134 may be external to the SPDM 130. Further, the flow meter 134 may be placed upstream from the vessel to generate a signal indicative of a volume flow rate of the carrier gas flowing into the vessel. The volume flow rate of the carrier gas may be used to approximated the volume flow rate of the process gas, for example, taking into consideration a percentage of the volume flow rate of the process gas contributed by the vaporized precursor 122, which may be directly proportional to a density of the precursor 122 in the process gas.

The gas analyzer 132 may be any suitable instrument capable of analyzing the process gas and generating a signal indicative of the precursor density. The gas analyzer 132 may use any suitable techniques, known or unknown, to generate the signal. Exemplary techniques include, but are not limited to, nuclear magnetic resonance (NMR), measuring density with ultrasonic transducers, and IR spectrometry. Fourier transform IR (FTIR) spectrometry, described in detail below, may be particularly well suited for precursor density analysis due to a high sensitivity in detecting material components in a gas.

Regardless of the measurement technique, the gas analyzer 132 generates the second signal on an output line 204 coupled with the integral controller 136. The second signal may be an analog signal, a serial communications signal (i.e., RS-232, RS-485, etc.), or a well-known industrial protocol bus signal, such as the General Purpose Interface Bus (GPIB).

The controller 136 may be any suitable controller capable of calculating a mass flow rate of the precursor 122 based on the signals generated by the flow meter 134 and the gas analyzer 132, respectively. For some embodiments, the controller may be a programmable logic controller (PLC) or a rack-mounted personal computer (PC). As illustrated, the controller 136 may comprise a central processing unit (CPU) 210, memory 212 and interface circuitry 214. The CPU 210 may be one of any form of computer processor that can be used in an industrial setting. The memory 212 may be one or more of readily available computer-readable medium, such as random access memory (RAM), read only memory (ROM), floppy disk, hard disk, or any other form of digital storage, local or remote.

Exemplary Method

Figure 3:
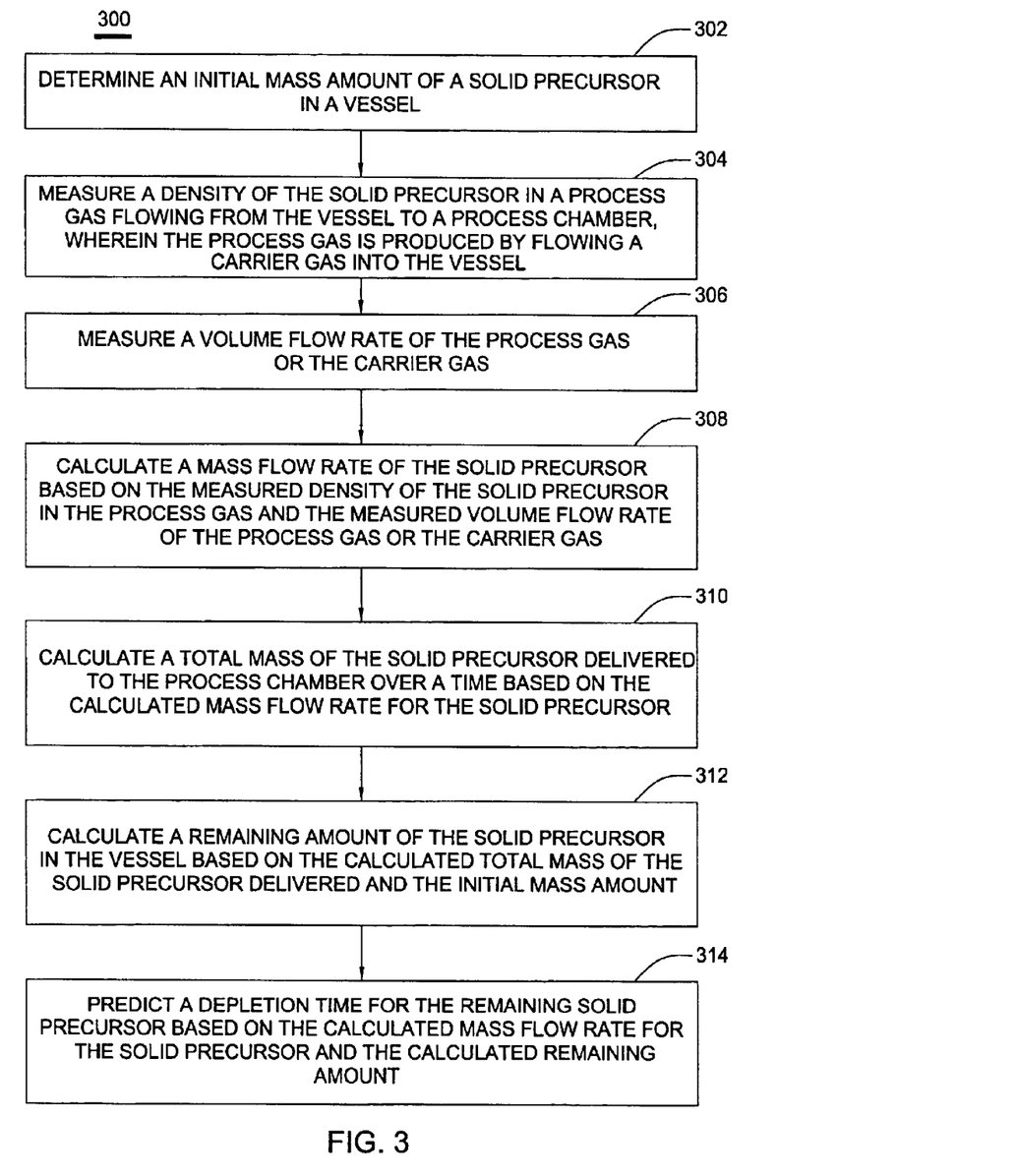
FIG. 3 is a flow diagram illustrating exemplary operations of a method for monitoring solid precursor delivery according to one embodiment.

FIG. 3 is a flow diagram illustrating exemplary operations of a method 300 for monitoring delivery of a precursor to a process chamber. The method 300 is generally stored in the memory 212 as a software routine. Although the method 300 is discussed as being implemented as a software routine, some of the method steps that are disclosed therein may be performed in hardware as well as by the integral controller 136. The operations of FIG. 3 will be described with reference to the embodiment illustrated in FIG. 2. The process 300 begins at step 302, by determining an initial mass amount of precursor in a vessel. The initial amount should be readily available from a vendor or possibly printed on an exterior of the vessel 124.

At step 304, a density of the precursor in a process gas flowing from the vessel to a process chamber is measured, wherein the process gas is produced by flowing a carrier gas into the vessel. For example, the controller 136 reads the signal generated by the gas analyzer 132 on output 204. At step 306, a volume flow rate of the process gas or the carrier gas is measured. For example, the controller 136 may read the signal generated by the process gas flow meter 134 on output 202. The interface circuitry 214 may comprise any combination of analog to digital (A/D) converters, digital signal processing (DSP) circuits and communications circuits required to convert the first and second output signals to a format suitable for use by the CPU 210.

The operations of steps 304 and 306 may be performed in any order and may be performed simultaneously. The precursor density and process gas volume flow rate may also be measured once, or several times, for a process cycle. For example, the precursor density may be measured M times for a process cycle, while the process gas volume flow rate is measured N times for a process cycle, with M and N comprising integers. The measurement frequencies may be determined by a response time of the gas analyzer 132 and flow meter 134. Further, the density of the precursor 122 may not be measured every process cycle, for example, if the density of the precursor 122 does not change rapidly with respect to the process cycle. A process cycle refers to a duration the precursor 122 is delivered by the process gas to the process chamber 110.

At step 308, a mass flow rate for the precursor is calculated based on the measured precursor density ($P_{SP}$) and the measured volume flow rate ($Q_{PG}$) of the process gas. Mass flow rate of the precursor ($MFR_{SP}$) is generally calculated from the precursor density ($P_{SP}$) and the process gas volume flow rate ($Q_{PG}$) according to the following equation:

$$MFR_{SP} = P_{SP} \times Q_{PG}.$$

However, because the precursor density and process gas volume flow rate may be measured at different intervals within a process cycle, for some embodiments, average values may be used. For example, average values of the precursor density and volume flow rate for a process cycle may be calculated by the following equations:

$$\overline{P_{SP}} = \sum_{n=1}^{M} P_{SP_n}/M \text{ and } \overline{Q_{PG}} = \sum_{n=1}^{N} Q_{PG_n}/N,$$

where M and N are the number of measurements of precursor density and process gas flow rate for a process cycle, respectively. These average values may then be used to calculate an average mass flow rate (MFR) for a process cycle using the following equation:

$$\overline{MFR} = \overline{P_{SP}} \times \overline{Q_{PG}}.$$

At step 310, a total mass of the precursor delivered to the process chamber for a given time is calculated based on the calculated mass volume flow rate for the precursor. In general, a total mass of the precursor delivered for a given process cycle ($M_{CYCLE}$) is determined by multiplying the mass flow rate for the cycle by the cycle time ($T_{CYCLE}$):

$$M_{CYCLE} = MFR_{SP} \times T_{CYCLE}.$$

However, an average value of the mass flow rate of the precursor 122 for process cycle may also be used. To calculate a total mass amount of precursor delivered over multiple (P) process cycles ($M_{TOTAL}$), the total mass amounts for each process cycle may be summed:

$$M_{TOTAL} = \sum_{CYCLE=1}^{P} M_{CYCLE}.$$

For some embodiments, the total mass of the precursor 122 delivered to the process chamber for one or more precursor delivery cycles may be monitored to ensure proper processing. For example, during a deposition process performed with a wafer in the process chamber, it may be desirable to deliver a an amount of the precursor 122 within a predetermined range to the process chamber over numerous cycles. The mass of the precursor 122 delivered for each cycle may be accumulated to assure the total mass delivered to the wafer over the numerous cycles is within the predetermined range. If the total mass delivered is below the predetermined range, for example, additional cycles may be performed until the total mass delivered is within the predetermined range.

At step 312, a remaining amount of the precursor is calculated based on the calculated total mass ($M_{TOTAL}$) of the precursor delivered to the process chamber 110 and an initial mass amount ($M_{INITIAL}$). The initial mass amount is typically the mass amount of the precursor 122 (in solid form) in a newly replaced or replenished vessel 124. The amount remaining ($M_{REMAINING}$) can be calculated from the following equation:

$$M_{REMAINING} = M_{INITIAL} - M_{TOTAL}.$$

Hence, embodiments of the present invention calculate an amount of precursor 122 remaining in the vessel 124.

At step 314, a precursor depletion time ($T_{DEPLETION}$) is predicted for the remaining precursor based on the calculated mass flow rate for the precursor, according to the following equation:

$$T_{DEPLETION} = M_{REMAINING}/MFR,$$

where MFR may be an average mass flow rate over several process cycles, or a mass flow rate of the most recent process cycle. The equation above provides a depletion time while the process gas is flowing. The total depletion time, including while the process gas is not flowing, may be calculated based on a percentage of time the process gas is flowing.

As an alternative to direct measurement of process gas flow rate at step 306, a volume flow rate of the process gas ($Q_{PG}$) may be approximated based on a measured volume flow rate of the carrier gas ($Q_{CG}$). The volume flow rate of the process gas ($Q_{PG}$) may be approximated from the following equation:

$$Q_{PG} = \psi \times Q_{CG},$$

where a value of $\psi$ may be determined as a function of the measured precursor density ($P_{SP}$). For example, the value of $\psi$ is one for a dilute mixture with no vaporized precursor in the carrier gas and $1/(1-F_{PFR})$ for a concentrated mixture, where $F_{PFR}$ is the fractional percentage of precursor flow rate of the total flow rate of the process gas ($Q_{PG}$). $F_{PFR}$ may be directly proportional to the measured precursor density ($P_{PS}$). At step 308, then, a mass flow rate for the precursor may be calculated based on the measured precursor density ($P_{SP}$) and the measured volume flow rate ($Q_{CG}$) of the carrier gas, according to the following equation:

$$MFR_{SP} = P_{SP} \times (\psi \times Q_{CG}).$$

Accordingly, an embodiment of the solid precursor delivery monitor (SPDM) may receive, from an external flow meter, a signal indicative of a volume flow rate of the carrier gas ($Q_{CG}$).

FTIR Spectrometry

As previously described, density of the precursor 122 in the process gas may be measured using FTIR spectrometry. Using FTIR spectrometry, material compositions in a gas may be determined by directing an IR beam from a source through a sample (the process gas) and measuring absorption, emission or scattering of different wavelengths of the IR beam. Absorption quantifies the amount of light absorbed by a sample as a function of wavelength (or frequency). Emission looks at light emitted by a source, and scattering looks at light that "bounces" off of atoms or molecules in the sample. Absorption measurement techniques will be described below, however embodiments of the present invention may measure absorption, emission or scattering.

Figure 4:
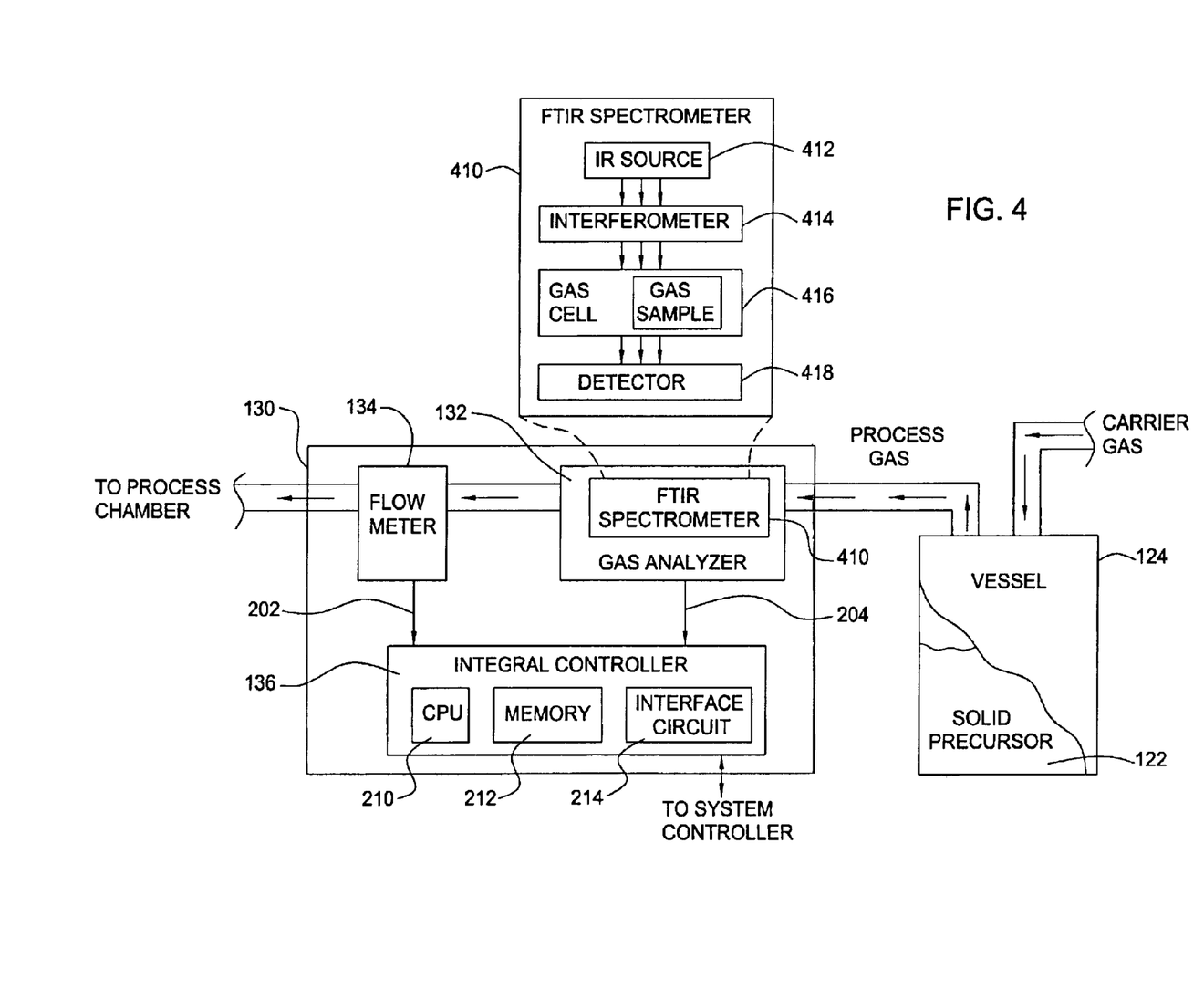
FIG. 4 illustrates an embodiment of a solid precursor delivery monitor having a Fourier transform infrared (FTIR) spectrometer.

FIG. 4 illustrates a gas analyzer 132 comprising an FTIR spectrometer 410 capable of measuring a density of the precursor 122 in the process gas. The FTIR spectrometer 410 comprises an IR source 412, an interferometer 414, a gas cell 416, and a detector 418. The process gas flows through a pathway in a gas cell 416. The IR source 412 directs an IR beam through the interferometer 414 through a sample portion of the process gas in the pathway. The interferometer 414 allows certain sets of wavelengths to pass depending on a location of an internal moving mirror (not shown). The internal mirror is moved to generate a range, or spectrum, of wavelengths. After passing through the sample, the IR beam intensity at the chosen wavelength is converted to an electrical signal by the detector 418.

The electrical signal is proportional to the light intensity and is typically plotted versus selected wavelength. A Fourier transform (FT) of the raw absorption data is performed in order to obtain the spectrum. The Fourier transform of the absorption data may be performed by the controller 136, or by a controller internal to the FTIR-based gas analyzer 132. The resulting graph of the absorption measurements is referred to as an absorption spectrum.

Figure 5:
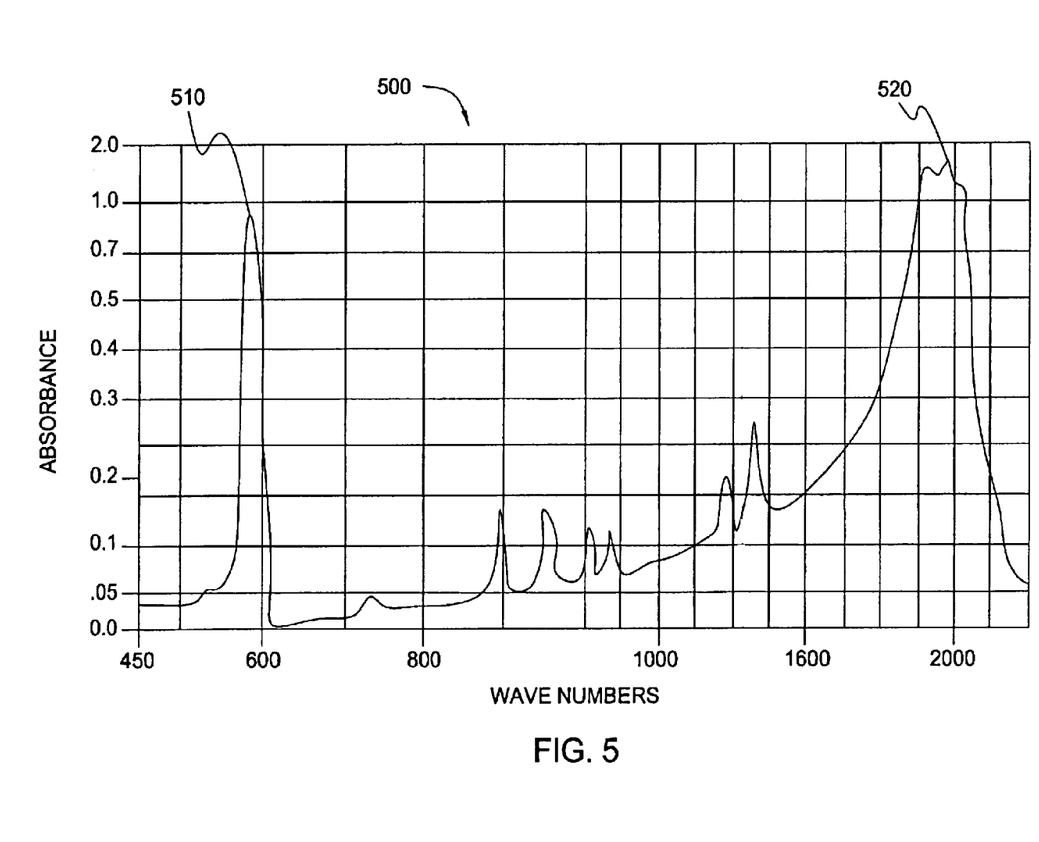
FIG. 5 illustrates an exemplary spectrum generated from the FTIR spectrometer of FIG. 4.

FIG. 5 illustrates an exemplary absorption spectrum 500 for tungsten carbonyl, $W(CO)_6$, that may be generated by the FTIR spectrometer 410. The vertical axis is proportional to the logarithm of light absorbed, and the horizontal axis is the wave number (1/wavelength) of light passed through the sample. As illustrated, the two sharp increases 510 and 520 in absorbance around wavenumbers 600 and 2000, respectively, indicate the presence of the precursor material (tungsten carbonyl, in this example) in the process gas. Using well known methods, the density of the precursor material may be determined by calculating an area below the rise in the curve around either one, or both of the wave numbers. For example, with an increased density of the precursor in the process gas, the area under the curve around both wavenumbers should increase by the same ratio. However, calculating a density using both wavenumbers may provide more confidence in the calculation.

Of course, the absorbance characteristics, such as the exact shape of the curve and which wavenumbers are absorbed, will vary depending on the precursor material. Regardless, the greater the density of the precursor material in the process gas, the sharper the rise in the curve at one or more wavenumbers. The density of the precursor material may be determined by calculating an area below the rise in the curve by well-known methods. The density of precursor determined from the absorption spectrum may then be used to calculate a mass flow rate of the precursor, as previously described.

Optimizing the FTIR Spectrometer

The pathlength of the gas cell 416 may dictate how sensitive the spectrometer is to absorption. In general, longer pathlengths allow samples with lower concentrations of samples to be measured. Typically, the concentration of the precursor 122 in the process gas is approximately 2%, and may range from below 0.5% to over 20%. To detect compositions in a gas sample in the parts per million (ppm) range, the gas cell 416 may be designed to have a pathlength of 1 to 10 meters, with an exact length depending on the precursor 122. For some embodiments, the pathlength may be approximately 5 meters, resulting in a resolution of 0.5 cm$^{-1}$ wavenumbers. Minimizing a volume of the pathlength may also be desirable to minimize overall dimensions of the gas cell 416. For example, for some embodiments, the gas cell 416 may have a pathlength of approximately 5 meters and a volume of 200 mL with overall dimensions of approximately 8.5 in. (W)×2 in. (H)×3.5 in. (D). However, for other embodiments, the gas cell 416 is not limited to any particular length or volume.

As illustrated above in the exemplary FTIR spectrum of FIG. 5, the precursor 122 will typically exhibit absorption features over a limited range of wavelengths. Because this limited range may be known beforehand, rather than generating an IR spectrum for the entire IR range, the FTIR spectrometer 410 may be optimized for this limited range. For example, if the precursor 122 is tungsten carbonyl, a limited spectrum including wavenumbers around 2000 and/or 600 may be sufficient. For some embodiments, the FTIR spectrometer 410 may comprise optical filters to limit a range of the IR spectrum generated. Accordingly, for some embodiments, an FTIR spectrometer 410 may be optimized to generate a spectrum for a limited range of wavenumbers determined by the precursor material. For example, the FTIR spectrometer 410 may be optimized to generate a spectrum for a range of wavenumbers associated with an FTIR spectrum for tungsten carbonyl or PDMAT. Further, for some embodiments, the FTIR spectrometer may be may be configurable for specific precursors.

Optimizing the FTIR spectrometer 410 for a limited range of wavelengths may have a number of advantages. A first advantage is that processing only a selected region may reduce a time required to generate a spectrum and process the spectrum data to calculate a precursor density. A second advantage is that a size and complexity of the FTIR spectrometer 410 may be reduced because, for example, an internal mirror of the interferometer 414 does not have to travel an entire length required to create the entire spectrum.

Process Control

Referring back to FIG. 1, for some embodiments, the SPDM 130 may communicate some or all of the calculated parameters (mass flow rate, total mass, etc.) to an external device. For example, the SPDM 130 may communicate with a system controller 140 through a connection 150. The connection 150 may comprise any suitable interface, such as a serial communications interface (i.e., RS-232, RS-485, etc.), or a well-known bus interface, such as the General Purpose Interface Bus (GPIB). The system controller 140 may be any suitable controller capable of monitoring and regulating the processes performed in the process chamber 110.

The system controller 140 may display information received from the SPDM 130 on a graphical user interface (GUI) 142. For example, the system controller 140 may display any one, or all of, a mass flow rate for the precursor 122, an amount of precursor 122 remaining in the vessel 124 and a predicted depletion time for the remaining amount. Further, the system controller 140 may be configured to generate an alarm message and/or an alarm output, for example, when an amount of the remaining precursor 122 falls below a threshold amount. The alarm message and/or alarm output may prompt an operator to replenish or replace the precursor 122.

The system controller 140 may also use the information received from the SPDM 130 as feedback to control delivery of the precursor 122 to the process chamber 110 in an attempt to maintain a target mass flow rate for the precursor 122. For example, the system controller 140 may compare a calculated mass flow rate received from the SPDM 130 to the target mass flow rate. In response to the comparison, the system controller 140 may attempt to adjust the mass flow rate of the precursor 122 by varying a temperature in the vessel 124 via a temperature controller to control the sublimation rate, or by varying a volume flow rate of the carrier gas into the vessel 124 by adjusting a valve 128.

Controlling delivery of the precursor 122 to the process chamber 110 may be particularly challenging for atomic layer deposition (ALD), because the process gas is delivered in short duration pulses. For example, the system controller 140 may generate the short duration pulses via pneumatically controlled (0.5 s) or electrically controlled (0.2 s) valves. For some embodiments, the SPDM 130 may determine an amount of precursor 122 delivered on each pulse, and communicate the information to the system controller 140. The system controller 140 may, for example, determine if an adequate amount of precursor 122 was delivered on a particular pulse and, if not, generate an additional pulse, or pulses, until an adequate amount has been delivered. As previously described, the amount of precursor 122 delivered on each pulse may be accumulated to ensure the amount of precursor 122 delivered to a wafer during a process cycle is within a predetermined range. The system controller 140 may generate additional pulses to ensure a consistent amount of precursor 122 is delivered for each wafer.

By directly measuring a density of a precursor in a process gas, embodiments of the present invention calculate an amount of the precursor remaining (as a solid) in a vessel. Operators may utilize the calculated amount of precursor remaining to efficiently schedule replacement or replenishment of the precursor. Accordingly, overall operating costs may be reduced by limiting material waste and operating down time. Further, calculated mass flow rates may be communicated back to a system controller for use in controlling delivery of the precursor from a gas delivery system to the process chamber. The calculated mass flow rates may be used as feedback to help achieve a target mass flow rate for the precursor.

While the foregoing is directed to the preferred embodiment of the present invention, other and further embodiments of the invention may be devised without departing from the basic scope thereof. The scope of the invention is determined by the claims that follow.

What is claimed is:

1. An apparatus for monitoring delivery of a solid precursor from a vessel to a process chamber via a process gas, comprising:

a gas analyzing means to generate a first signal indicative of a density of the precursor in the process gas; and a controller to receive the first signal and a second signal indicative of a volume flow rate of the process gas or a carrier gas flowing into the vessel to produce the process gas, wherein the controller is configured to calculate an amount of precursor remaining in the vessel based, at least in part, on the first and second signals.

2. The apparatus of claim 1, wherein the controller is also configured to calculate a total mass of the precursor delivered to the process chamber.

3. The apparatus of claim 2, wherein the controller is configured to:
calculate a mass flow rate of the precursor based on the first and second signals; and
calculate an amount of precursor remaining in the vessel based on the mass flow rate and an initial amount.

4. The apparatus of claim 3, wherein the controller is also configured to predict an amount of processing time remaining before the precursor is depleted.

5. The apparatus of claim 1, wherein the precursor comprises a precursor to deposit a layer of conductive material.

6. The apparatus of claim 1, wherein the precursor comprises a metalorganic material.

7. The apparatus of claim 6, wherein the precursor comprises tungsten carbonyl.

8. The apparatus of claim 1, wherein the controller is configured to communicate the mass flow rate of the precursor to an external device.

9. The apparatus of claim 1, wherein the gas analyzing means comprises a gas analyzer utilizing ultrasonic transducers to generate the first signal.

10. The apparatus of claim 1, wherein the controller is configured to communicate, to an external device, at least one of:
the mass flow rate of the precursor; and
the amount of precursor remaining in the vessel.

11. An apparatus for monitoring delivery of a solid precursor from a vessel to a process chamber via a process gas, comprising:
a gas analyzer having a Fourier transform infrared (FTIR) spectrometer to generate a first signal indicative of a density of the precursor in the process gas, wherein the FTIR spectrometer is optimized for a limited range of wavenumbers dependent on a material of the precursor;
a flow meter to generate a second signal indicative of a volume flow rate of the process gas; and
a controller configured to calculate a mass flow rate of the precursor based on the first and second signals.

12. The apparatus of claim 11, wherein the gas analyzer further comprises a gas cell having a pathlength between 1.0 meters and 10.0 meters.

13. The apparatus of claim 12, wherein the pathlength is approximately 5.0 meters.

14. The apparatus of claim 12, wherein a volume of the gas cell is 200 ml or less.

15. A method for monitoring delivery of a solid precursor from a vessel to a process chamber, comprising:
measuring a density of the precursor in a process gas flowing from the vessel to the process chamber, wherein the process gas is produced by flowing a carrier gas into the vessel;
measuring a volume flow rate of the process gas or the carrier gas; and
calculating an amount of the precursor remaining in the vessel based on the measured density of the precursor in the process gas and the measured volume flow rate of the process gas or the carrier gas.

16. The method of claim 15, further comprising calculating a total mass of precursor delivered to the process chamber over an amount of time.

17. The method of claim 16, wherein calculating the amount of precursor remaining in the vessel comprises calculating the amount or precursor remaining in the vessel based on the total mass of precursor delivered to the process chamber over the amount of time and an initial amount.

18. The method of claim 17, further comprising predicting a depletion time based on the calculated amount of precursor remaining and the calculated mass flow rate.

19. The method of claim 15, wherein calculating a mass flow rate of the precursor based on the measured density of the precursor in the gas and the measured volume flow rate of the process gas comprises averaging at least two measurements of the density of the precursor in the process gas.

20. The method of claim 15, wherein measuring a density of a precursor in a process gas flowing from a vessel to a process chamber comprises generating a Fourier transform infrared (FTIR) spectrum.

21. The method of claim 15 further comprising adjusting a temperature of the precursor based on the calculated mass flow rate.

22. The method of claim 15, further comprising calculating a total mass of precursor delivered to a wafer in the process chamber for one or more gas delivery cycles.

23. A method for monitoring delivery of a solid precursor from a vessel to a process chamber, comprising:
generating a Fourier transform infrared (FTIR) spectrum of a process gas flowing from the vessel to the chamber, wherein the process gas is produced by flowing a carrier gas into the vessel and the FTIR spectrum is generated for a limited range of wavenumbers selected based on the precursor;
calculating a density of the precursor in the process gas based on the FTIR spectrum;
measuring a volume flow rate of the process gas or the carrier gas; and
calculating a mass flow rate of the precursor based on the measured density of the precursor in the process gas and the measured volume flow rate of the process gas or the carrier gas.

24. A system comprising:
a process chamber;
a gas delivery system to deliver a solid precursor from a vessel to the process chamber via a process gas produced by flowing a carrier gas into the vessel; and
a precursor monitoring apparatus disposed between the process chamber and the gas delivery system, the precursor monitoring apparatus having a gas analyzer to generate a first signal indicative of a density of the precursor in the process gas and an integral controller to receive the first signal and a second signal indicative of a volume flow rate of the process gas or the carrier gas, wherein the integral controller is configured to calculate a mass flow rate of the precursor based on the first and second signals and an amount of precursor remaining in the vessel based on the mass flow rate of the precursor and an initial amount.

25. The system of claim 24, wherein the gas analyzer comprises a Fourier transform infrared (FTIR) spectrometer.

26. The system of claim 25, wherein the integral controller is configured to communicate the amount of precursor remaining in the vessel to a system controller.

27. The system of claim 24, wherein the system controller is configured to display the amount of precursor remaining in the vessel on a graphical user interface (GUI).

28. The system of claim 24, wherein the system controller is configured to generate an alarm message on the GUI in response to determining that the amount of precursor remaining in the vessel is below a threshold value.

29. The system of claim 24, wherein the integral controller is configured to communicate to a system controller information comprising at least one of:

a) the amount of precursor remaining in the vessel; and b) the mass flow rate of the precursor.

30. The system of claim 29, wherein the system controller is configured to regulate delivery of the precursor by the gas delivery system based on the information received from the integral controller.

31. The system of claim 30, wherein the system controller regulates delivery of the precursor by adjusting a temperature of the precursor within the vessel.

32. The system of claim 31, wherein the system controller regulates delivery of the precursor by adjusting a volume flow rate of the carrier gas.

33. The system of claim 24, wherein the integral controller is further configured to calculate a total amount of precursor delivered to a wafer in the process chamber during one or more precursor delivery cycles.

34. An apparatus for monitoring delivery of a solid precursor from a vessel to a process chamber via a process gas, comprising:

a gas analyzer utilizing ultrasonic transducers to generate a first signal indicative of a density of the precursor in the process gas;

a flow meter to generate a second signal indicative of a volume flow rate of the process gas; and a controller configured to calculate a mass flow rate of the precursor based on the first and second signals and to calculate an amount of precursor remaining in the vessel based on an initial amount.

35. The apparatus of claim 34, wherein the controller is also configured to predict an amount of processing time remaining before the precursor is depleted.

* * * * *